United States Patent
Fitzsimmons et al.

(10) Patent No.: US 9,929,085 B2
(45) Date of Patent: Mar. 27, 2018

(54) INTEGRATED CIRCUIT STRUCTURE HAVING DEEP TRENCH CAPACITOR AND THROUGH-SILICON VIA AND METHOD OF FORMING SAME

(71) Applicant: GLOBALFOUNDRIES INC., Grand Cayman (KY)

(72) Inventors: John A. Fitzsimmons, Poughkeepsie, NY (US); Mukta G. Farooq, Hopewell Junction, NY (US); Anthony K. Stamper, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/171,320

(22) Filed: Jun. 2, 2016

(65) Prior Publication Data
US 2017/0352618 A1    Dec. 7, 2017

(51) Int. Cl.
*H01L 23/522* (2006.01)
*H01L 23/498* (2006.01)
*H01L 21/48* (2006.01)
*H01L 49/02* (2006.01)

(52) U.S. Cl.
CPC ........ *H01L 23/5223* (2013.01); *H01L 21/486* (2013.01); *H01L 21/4846* (2013.01); *H01L 21/4853* (2013.01); *H01L 23/498* (2013.01); *H01L 23/49827* (2013.01); *H01L 23/49894* (2013.01); *H01L 28/40* (2013.01)

(58) Field of Classification Search
CPC .................. H01L 29/945; H01L 29/66181
See application file for complete search history.

(56) References Cited

U.S. PATENT DOCUMENTS

| | | |
|---|---|---|
| 5,148,266 A | 9/1992 | Khandros et al. |
| 6,516,513 B2 | 2/2003 | Milkovich et al. |
| 7,863,106 B2 | 1/2011 | Christo et al. |
| 8,242,604 B2 | 8/2012 | Volant et al. |
| 8,298,863 B2 | 10/2012 | Simmons-Matthews |
| 8,394,715 B2 | 3/2013 | Volant et al. |
| 8,658,535 B2 | 2/2014 | Andry et al. |
| 8,691,691 B2 | 4/2014 | Farooq et al. |
| 8,759,154 B2 | 6/2014 | Simmons-Matthews |
| 8,860,230 B2 | 10/2014 | Schmitt et al. |
| 8,956,973 B2 | 2/2015 | Farooq et al. |

(Continued)

FOREIGN PATENT DOCUMENTS

| | | |
|---|---|---|
| CN | 103943558 A | 7/2014 |
| CN | 103956333 A | 7/2014 |

*Primary Examiner* — Daniel Whalen
(74) *Attorney, Agent, or Firm* — Michael Le Strange; Hoffman Warnick LLC

(57) ABSTRACT

One aspect of the disclosure relates to an interposer. The interposer may include: a first dielectric layer extending from a substrate in a direction away from a front side of the substrate; a back-end-of-the-line (BEOL) region extending from the substrate in a direction away from the back side of the substrate; a deep trench (DT) capacitor within the substrate and extending toward a back side of the substrate, the DT capacitor having a first portion within the substrate and a second portion within the first dielectric layer; and a through silicon via (TSV) adjacent to the DT capacitor and extending through the first dielectric layer, the substrate, and the BEOL region.

15 Claims, 13 Drawing Sheets

(56) References Cited

U.S. PATENT DOCUMENTS

| | | |
|---|---|---|
| 2009/0127667 A1 | 5/2009 | Iwata |
| 2010/0308435 A1* | 12/2010 | Nowak ............. H01L 21/76898 |
| | | 257/532 |
| 2011/0095435 A1 | 4/2011 | Volant et al. |
| 2012/0133021 A1* | 5/2012 | Joblot ............... H01L 21/76898 |
| | | 257/532 |
| 2014/0183719 A1 | 7/2014 | Simmons-Matthews |
| 2014/0256088 A1 | 9/2014 | Onodera |
| 2015/0028450 A1 | 1/2015 | Park et al. |

\* cited by examiner

INTEGRATED CIRCUIT STRUCTURE HAVING DEEP TRENCH CAPACITOR AND THROUGH-SILICON VIA AND METHOD OF FORMING SAME

CROSS-REFERENCE TO RELATED APPLICATIONS

This disclosure relates to commonly owned and co-pending application Ser. No. 15/171,314, entitled "INTEGRATED CIRCUIT STRUCTURE HAVING DEEP TRENCH CAPACITOR AND THROUGH-SILICON VIA AND METHOD OF FORMING SAME", filed concurrently herewith, the entire contents of which are herein incorporated by reference.

BACKGROUND

Technical Field

The present disclosure relates to integrated circuit structures, and more particularly, to an integrated circuit structure, such as an interposer, having a deep trench (DT) capacitor and through-silicon via (TSV) and method of forming the same.

Related Art

Interposers are thinned silicon die which are interposed between active or logic silicon and a packaging substrate. Interposers enable heterogeneous integration of die from various technology nodes to create an optimal cost-performance solution. Interposers with deep trench (DT) capacitors are capable of delivering powerful reductions in mid-frequency noise, thus, further enhancing system performance. Interposers may include through-silicon vias (TSVs) for joining chips (or dies) by vertically interconnecting through the interposer and functioning as components of an integrated circuit.

Stacking chips in comparison to wire bonding, reduces inductive losses which increases speed of data exchange. Since TSVs have shorter interconnects between the dies, there is a reduced power consumption caused by the conventional long horizontal wiring. As a result, TSVs allow much higher input/output density than wire bonding, which consumes much more space.

In this manner, TSVs allow multiple integrated circuit chips to be stacked together, allowing greater amounts of information to be passed between the chips. For example, integrated circuit chips and memory devices, which typically reside side-by-side on a silicon wafer, can be stacked on top of one another with the advent of the TSVs. Stacking the integrated circuit chips with the memory devices dramatically reduces the size of the overall chip package and boost speeds at which data flows among the functions on the chip. Signal transmission through TSVs in conventional silicon interposers are not as efficient as with other materials, such as glass. However, DT capacitors cannot be fabricated in as fine dimensions in glass as they can be with silicon.

SUMMARY

A first aspect of the disclosure relates to a method of forming an integrated circuit structure. The method may include: providing a substrate having a front side and back side, the substrate including: a deep trench (DT) capacitor within the substrate extending toward the back side of the substrate; etching the back side of the substrate to expose the DT capacitor on the back side of the substrate; forming a first dielectric layer covering the exposed DT capacitor on the back side of the substrate and extending away from the front side of the wafer; and forming a through silicon via (TSV) adjacent to the DT capacitor from the front side of the substrate and extending toward the back side of the substrate within the first dielectric layer, the TSV including a metal substantially surrounded by a liner layer.

A second aspect of the disclosure relates to an interposer. The interposer may include: a first dielectric layer extending from a substrate in a direction away from a front side of the substrate; a back-end-of-the-line (BEOL) region extending from the substrate in a direction away from the back side of the substrate; a deep trench (DT) capacitor within the substrate and extending toward a back side of the substrate, the DT capacitor having a first portion within the substrate and a second portion within the first dielectric layer; and a through silicon via (TSV) adjacent to the DT capacitor and extending through the first dielectric layer, the substrate, and the BEOL region.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

The present disclosure relates to integrated circuit structures, and more particularly, to an integrated circuit structure, such as an interposer, having a deep trench (DT) capacitor and through-silicon via (TSV) and method of forming the same. For ease of illustration, the disclosure is discussed as employed for interposers. However, it is to be understood that the disclosure is equally applicable to full device structures, e.g., an active device chip in combination with an interposer, three-dimensional logic chip, etc., as well. Signal transmission through TSVs in conventional silicon or semiconductor interposers are not as efficient as with other materials, such as glass. However, DT capacitors cannot be fabricated in as fine dimensions in glass as they can be with silicon or semiconductor. The present disclosure provides for a method and integrated circuit structure that replaces much of the silicon or semiconductor on the interposer with a dielectric material, e.g., polyimide, in order to increase signal transmission through TSVs. Additionally, this method is performed subsequent to the formation of DT capacitors. Therefore, DT capacitors can be fabricated with fine dimensions in silicon before the silicon is replaced with the dielectric material. As such, the present disclosure both maintains the benefits of having DT capacitors with fine dimensions and increases signal performance of TSVs. The percentage of the silicon that is removed that surrounds the DT capacitors can be determined by a function of DT capacitance requirements versus alpha particles and dielectric leakage loss. For maximum capacitance of the DT capacitors, minimal removal occurs surrounding the DT capacitors, thus the DT capacitors may be fully buried in silicon. As such, the present disclosure both maintains the benefits of having DT capacitors with fine dimensions and increases signal performance of TSVs.

Figure 1:
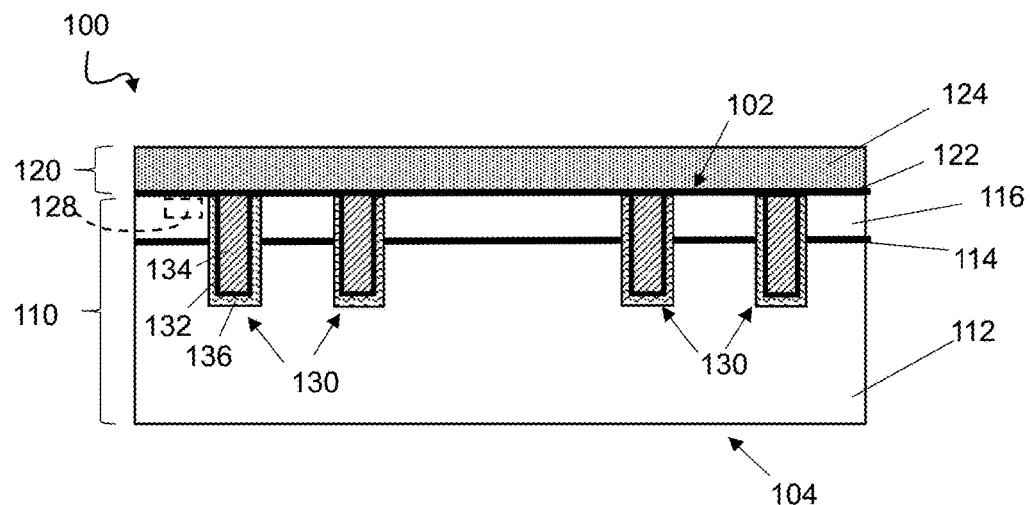
FIGS. 1-4 show cross-sectional views of a wafer undergoing preliminary aspects of a method according to an embodiment of the disclosure.

FIG. 1 shows a cross-sectional view of a preliminary wafer 100, e.g., a passive silicon interposer, that is to undergo aspects of a method according to embodiments of the disclosure as described herein. Wafer 100 may include a substrate 110 having a front side 102 and a back side 104. Substrate 110 may include a semiconductor layer 112. Overlying semiconductor layer 112 may be a buried insulator layer 114, and overlying buried insulator layer 114 may be a semiconductor-on-insulator (SOI) layer 116. However, in other embodiments, (not shown) substrate 110 may include a bulk silicon substrate.

Semiconductor layer 112 and SOI layer 116 may each include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Buried insulator layer 114 may include silicon oxide (BOX layer) or other inorganic dielectric materials. However, as mentioned substrate 110 may include a bulk silicon substrate in other embodiments.

Wafer 100 may also include a back-end-of-the-line (BEOL) region 120 over front side 102. BEOL region 120 may include a transition region 122 representing the transition from front-end-of-line (FEOL) having device structures to BEOL construction. FEOL construction may reside within SOI layer 116. For example, SOI layer 116 may include integrated circuit devices 128 (shown in phantom), or portions thereof, such as but not limited to transistors, resistors, interconnects, etc. BEOL region 120 may also include BEOL layer 124 having contacts and wiring structures as is known in the art but shown as a single layer/material herein for brevity. Transition region 122 facilitates the prevention of contaminants from BEOL region 120 entering into the FEOL region. Generally, refractory metals and high temperature diffusion barriers against copper and mobile ions, are used in transition region 122. BEOL processing includes the series of processes in which wiring is formed to connect to the semiconductor devices formed during FEOL processing. BEOL processing generally begins when the first layer of metal wiring is formed on the wafer subsequent to the transition region. In some technologies, transition region 122 may be called the MOL (middle of line), which connects the FEOL to the BEOL.

Wafer 100 may also include passive devices such as at least one deep trench (DT) capacitor 130. DT capacitors 130 may be disposed within substrate 110 and extend from front side 102 toward back side 104. In some embodiments, DT capacitors 130 may contact BEOL region 120. DT capacitors 130 may include a liner layer 132, e.g., titanium nitride, tantalum nitride, tungsten nitride, tantalum, titanium, or other thermally stable material having attribute for FEOL processing, and an inner conductor layer 134, e.g., polysilicon or other conductor having similar properties or capable of performing similar functions, within liner layer 132. DT capacitors 130 include an insulating layer 136 which serves as a capacitor dielectric and substantially surrounds liner layer 132 such that liner layer 132 is substantially between insulating layer 136 and inner conductor layer 134. Insulating layer 136 may include, for example, an oxide, such as silicon dioxide or hafnium oxide, or nitride, such as silicon nitride. Insulating layer 136, liner layer 132 and inner conductor layer 134 may be planar with a surface of SOI layer 116 that is on front side 102. As used herein, "substantially" refers to largely, for the most part, entirely specified or any slight deviation which provides the same technical benefits of the invention.

Wafer 100 may be initially formed by forming buried insulator layer 114 over semiconductor layer 112 and SOI layer 116 over buried insulator layer 114 such as by deposition or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Further, trench openings or discrete columnar openings (not shown) may be formed in substrate 110 to facilitate the formation of DT capacitors 130. For ease of description, the term trench openings may represent all such openings. A mask (not shown) may be formed over SOI layer 116 and patterned such that portions of the mask are removed to expose portions of SOI layer 116 thereunder, where DT capacitors 130 are to be formed. Exposed portions of SOI layer 116, including buried insulator layer 114 and semiconductor layer 112 thereunder, may then be etched to form the trench openings. Subsequently, the remaining portions of the mask may be removed. Liner layer 132 may be formed, e.g., deposited, within the trench openings to substantially line the trench openings. Inner conductor layer 134 may be formed, e.g., deposited, within the trench openings over liner layer 132. DT capacitors 130 also include insulating layer 136. In such an embodiment, insulating layer 136 may be formed, e.g., deposited within the trench openings to substantially line the trench openings prior to the formation of liner layer 132. Insulating layer 136, liner layer 132, and inner conductor 134 may be planarized to a surface of SOI layer 116 at front side 102.

The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask."

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a chemical (such as an acid) which may be chosen for its ability to selectively dissolve a given material (such as oxide), while leaving another material (such as polysilicon) relatively intact. The ability to selectively etch particular materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutral or charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a retaining ring, which may be made of plastic. The dynamic polishing head is rotated with different axes of rotation (that is, not concentric). This removes material and tends to even out any "topography," making the wafer flat and planar.

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; gas-cluster ion-beam; and/or (x) sacrificial etch-back.

Further, BEOL region 120 may be formed over SOI layer 116 on front side 102 of substrate 110 extending away from back side 104. That is, BEOL layer 124 may be formed as known in the art to include several metal wiring levels having both active and passive semiconductor devices therein such that a transition region 122 from BEOL layer 124 and FEOL region, i.e., SOI layer 116, is formed over SOI layer 116 and DT capacitors 130.

Figure 2:
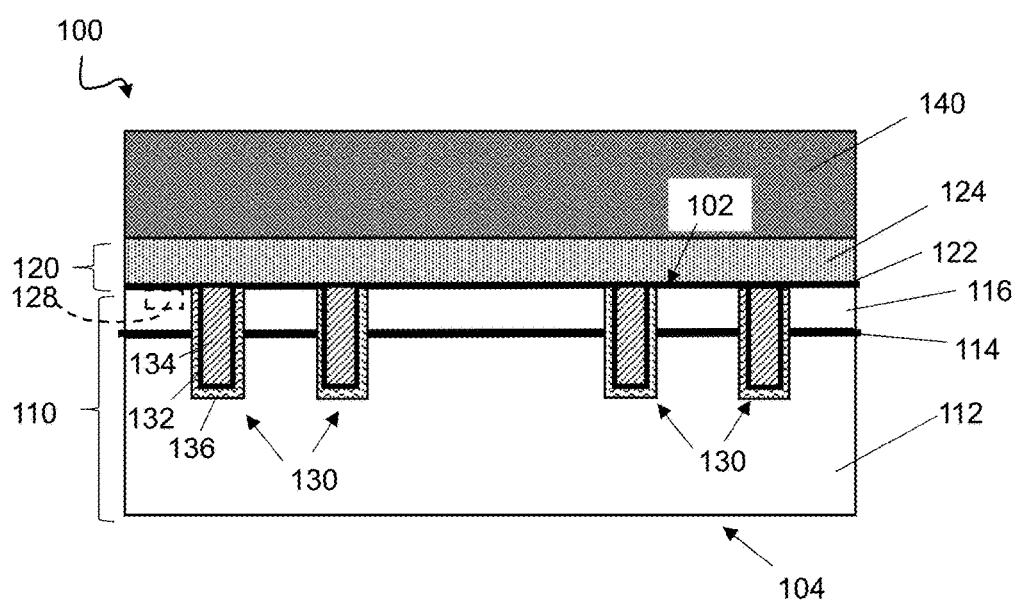

Referring now to FIG. 2, a handle wafer 140 may be formed over front side 102 such that handle wafer 140 covers BEOL region 120 and extends away from back side 104. Handle wafer 140 may be bonded to wafer 100 using standard processes, such as temporary adhesive bonding. As known in the art, handle wafer 140 may include, for example, bulk silicon or glass. Handle wafer 140 provides mechanical support to wafer 100 such that wafer 100 may be manipulated to undergo additional processing.

Figure 3:
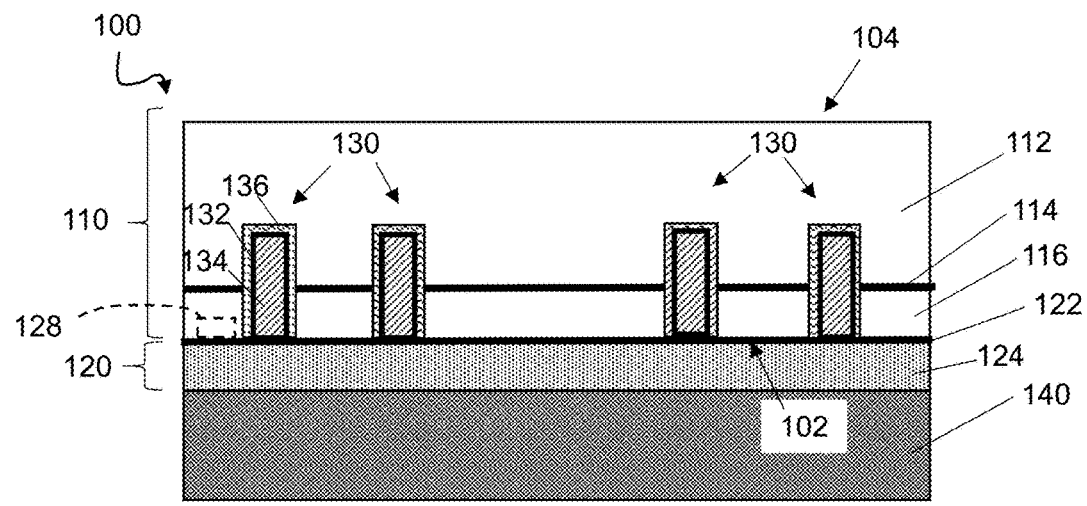
Figure 4:
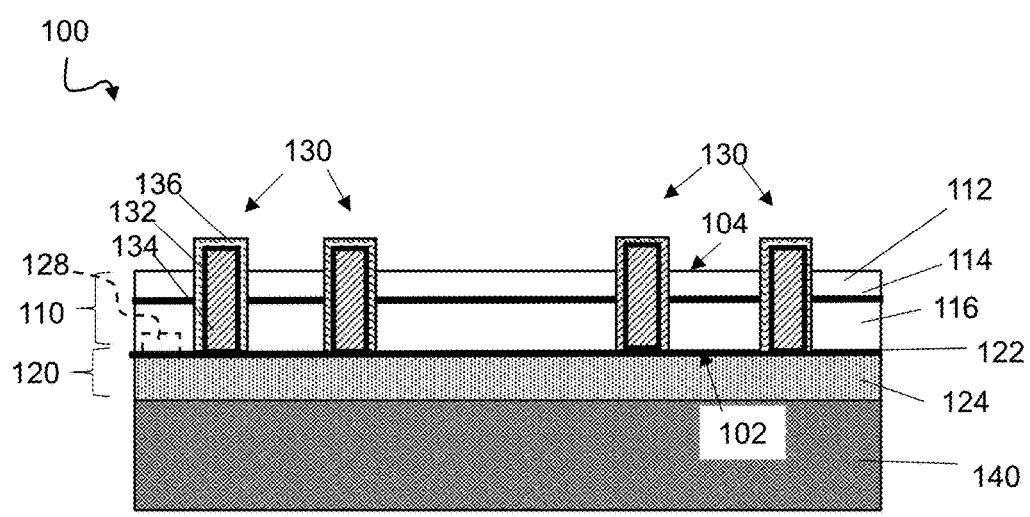

Referring to FIG. 3, wafer 100 may be flipped or turned over such that back side 104 may undergo additional processing. As shown in FIG. 4, substrate 110 may be etched back. In some embodiments, substrate 110 may be etched back to at least partially expose DT capacitors 130. In some embodiments, a RIE process may be employed to etch substrate 110 towards buried insulator layer 114 to partially expose DT capacitors 130. In this type of etching, the etch process will not etch a dielectric or insulator, rather, the etch process is designed to etch specific inorganic materials, such as semiconductor layer 112. The RIE process can be selective to semiconductor layer 112 over buried insulator layer 114 by proper parameter selection. For example, sulfur hexafluoride or xenon difluoride can be used to etch semiconductor layer 112 and not aggressively etch buried insulator layer 114. Power and chemistry parameters can be varied to enhance semiconductor layer 112 selectivity versus buried insulator layer 114 selectivity. In this way, buried insulator 114 may act as a natural stop for the etch process thereby protecting semiconductor devices 128. Additionally, since DT capacitors 130 include insulator layer 136, insulator layer 136 will act as an etch stop. However, the silicon electrode surrounding the dielectric layer will be reduced, with a concomitant reduction in DT capacitance. In some embodiments (shown), it may be desirable to etch substrate 110 such that a portion of semiconductor layer 112 remains. While FIG. 4 shows substrate 110 being etched such that a portion of semiconductor layer 112 remains, it is to be understood that substrate 110 may be etched to any desirable depth without departing from aspects of the disclosure. In some embodiments, substrate 110 may be etched to buried insulator layer 114 such that barrier insulator layer 114 is exposed. In other embodiments, substrate 110 may be etched to a thickness that either partially exposes or does not expose DT capacitors 130. That is, substrate 110 may be etched such that DT capacitors 130 remain surrounded by substrate 110. In another embodiment, where substrate 110 includes bulk silicon, substrate 110 may be selectively etched to any thickness between no exposure of DT capacitor 130 or to a thickness just above the semiconductor devices 128 thereby ensuring that semiconductor devices 128 are not affected during the etch. That is, a timed etch may be employed such that substrate 110 undergoes etching for a particular duration of time at a particular rate that terminates prior to semiconductor devices 128. The time for the etch may be determined by the etch rate of the material used for substrate and the desired etch depth, taking into consideration the resistance to etch of the dielectric layers. The percentage of the substrate 110 that surrounds DT capacitors 130 may be determined by a function of DT capacitance requirements versus desired effect of alpha particles and dielectric leakage loss. For maximum capacitance of DT capacitors 130, minimal removal occurs surrounding DT capacitors 130. Thus, DT capacitors 130 may be fully buried in substrate 110.

Figure 5:
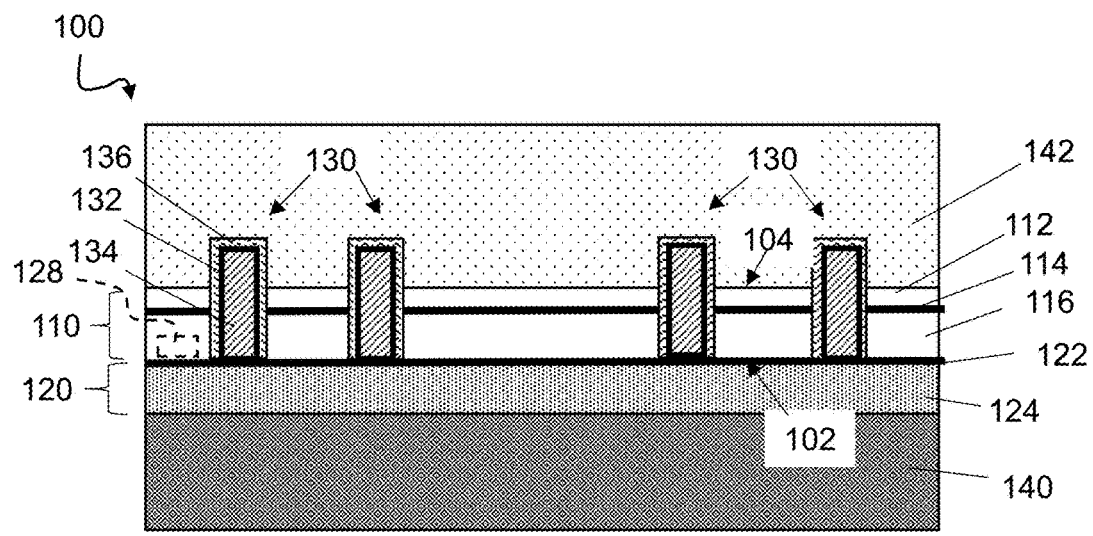
FIGS. 5-13 show cross-sectional views of the wafer undergoing aspects of a method according to an embodiment of the disclosure.

Referring now to FIG. 5, a dielectric layer 142 may be formed, e.g., deposited, over exposed DT capacitors 130 and semiconductor layer 112. In other embodiments, dielectric layer 142 may be formed over semiconductor layer 112 where DT capacitors 130 remain encased in substrate 110. Additionally, where DT capacitors 130 are fully exposed, dielectric layer 142 may be formed over buried oxide 114. In any embodiment, dielectric layer 142 may be formed on back side 104 extending away from front side 102. Dielectric layer 142 may include polymers and/or organic insulators such as polyimide (such as standard Kapton® or advanced Kapton® available from DuPont), polystyrene, polypropoylene, polyethylene, polycarbonate, and/or inorganic materials such as silicon oxide ($SiO_2$) and aluminum oxide ($Al_2O_3$). Other dielectric materials can include, e.g., silicon nitride, fluorinated silicon dioxide (FSG), hydrogenated silicon oxycarbide (SiCOH), porous SiCOH, borophospho-silicate glass (BPSG), silsesquioxanes, near frictionless carbon (NFC), carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, flex epoxy adhesive, flex acrylic adhesive, Teflon®, other low dielectric constant (<3.9) material, or layers thereof.

Figure 6:
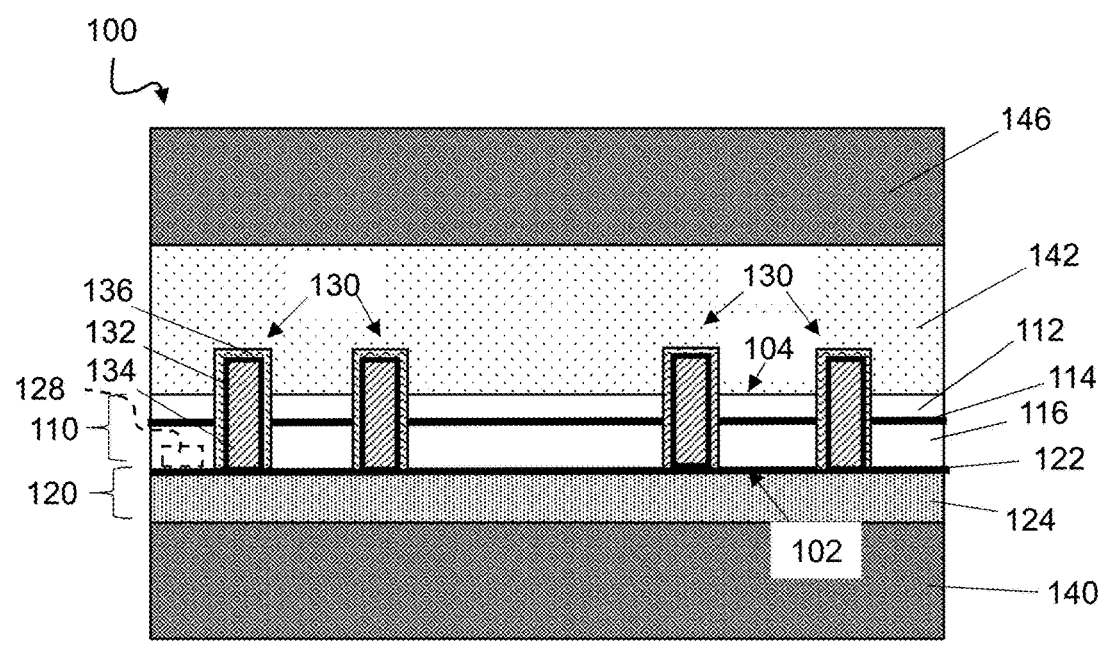
Figure 7:
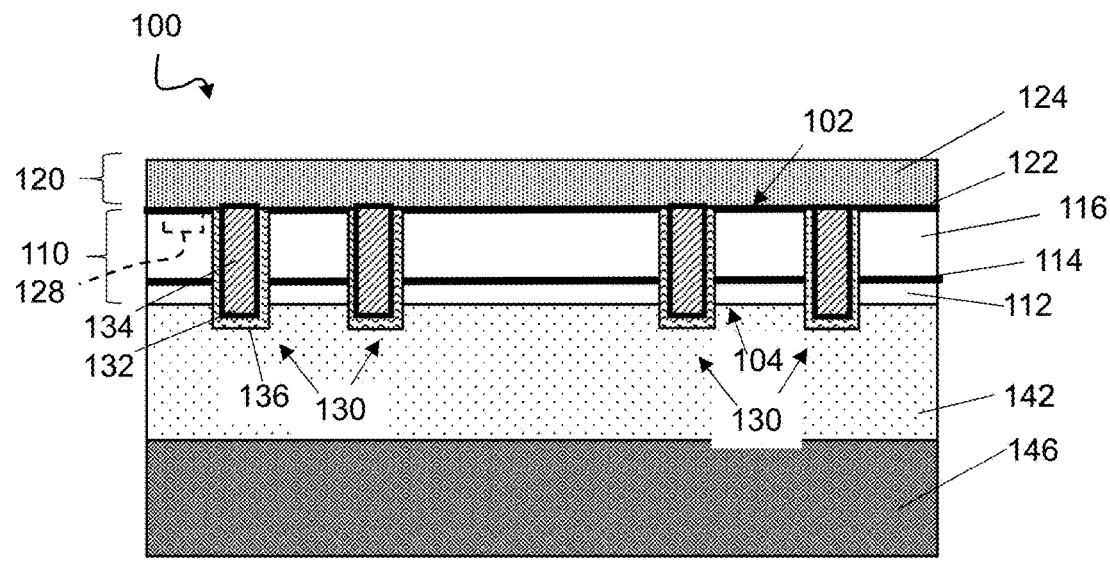

As shown in FIG. 6, another handle wafer 146 may be formed on back side 104 over dielectric layer 142 extending away from front side 102. Additionally, handle wafer 140 on front side 102 may be removed to expose BEOL region 120 so that wafer 100 can be turned over or flipped such that front side 102 may undergo additional processing as shown in FIG. 7.

Figure 8:
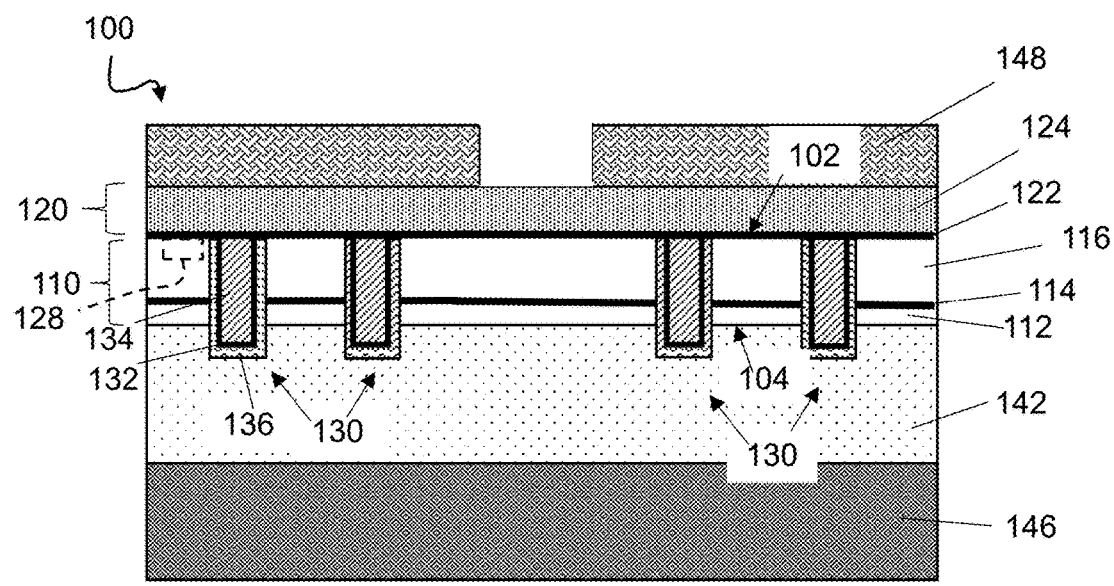
Figure 9:
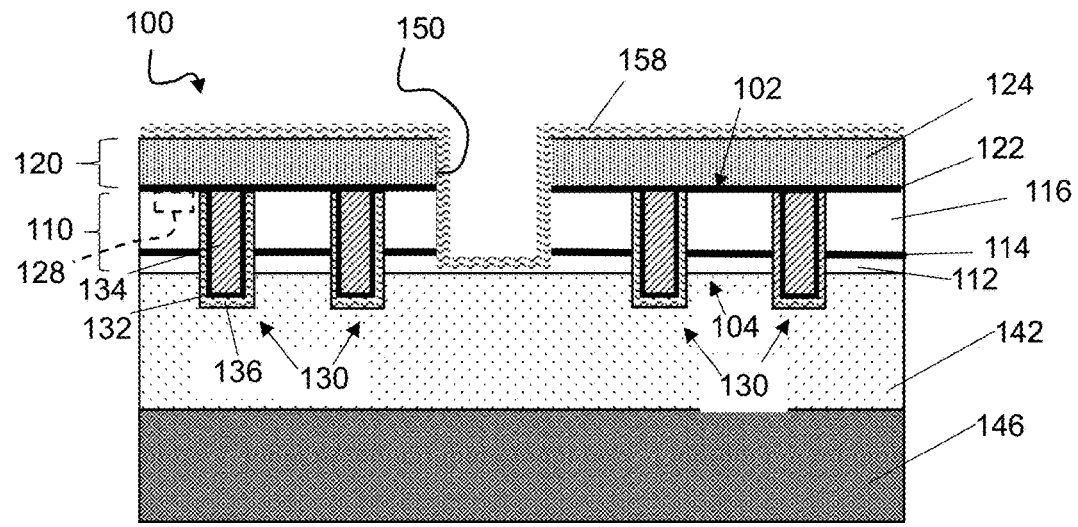
Figure 10:
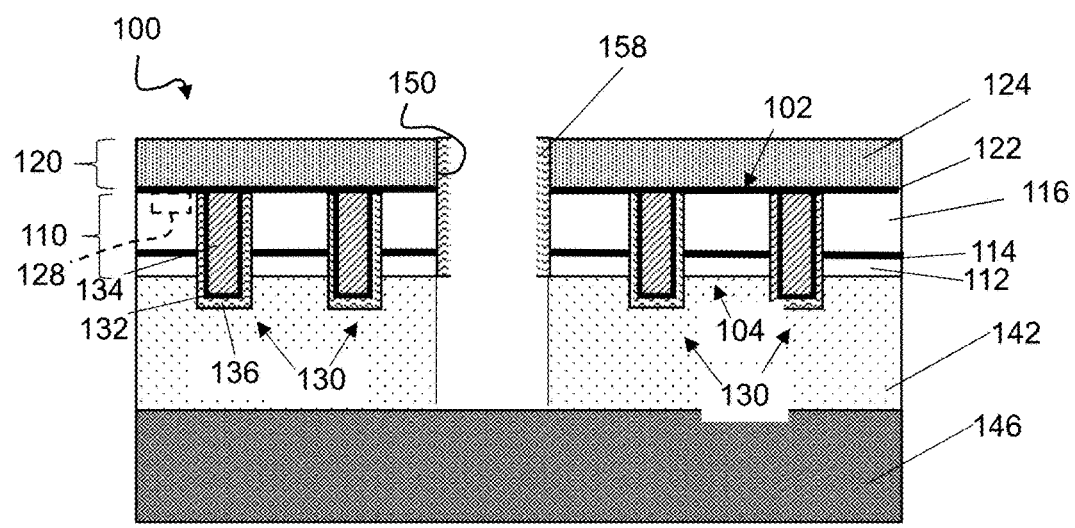

Referring now to FIG. 8, a mask 148 may be formed over BEOL region 120 on front side 102 extending away from back side 104. Mask 148 may be patterned and etched to expose BEOL region 120 to facilitate the formation of an opening 150 as shown in FIG. 9. After BEOL region 120 is exposed, opening 150 may be formed within BEOL region 120 and substrate 110. Opening 150 may be formed, for example, via etching, through BEOL region 120 and substrate 110 to expose dielectric layer 142. That is, BEOL layer 124, transition region 122, SOI layer 116, buried insulator layer 114, and semiconductor layer 112 may be etched to expose dielectric layer 142. A deep RIE, e.g., a Bosch etch, may be employed to remove portions of substrate 110 and BEOL region 120 to expose dielectric layer 142. Deep RIE etching may include a pulsed or time-multiplexed etching. During a method of deep RIE, a mode of an isotropic etch is alternated with a deposition of a chemically inert passivation layer (not shown). In this etch process, mask 148 (FIG. 8) may be eroded or fully removed. Additionally, after this etch process, the chemically inert passivation layer may be removed and an insulating layer 158 may be deposited, protecting the sidewalls of the opening 150 as shown in FIG. 10. Insulating layer 158 may be conformally deposited such that insulating layer 158 substantially lines sidewalls of opening 150 and is at least partially over dielectric layer 142 on a surface of dielectric layer 142 closest to front side 102 within opening 150. Additionally, insulating layer 158 may be formed over a surface of BEOL region 120 that is farthest from back side 104 outside of opening 150. Subsequently a directional RIE may be used to remove insulating layer 158 from all horizontal surfaces, including from the surface of dielectric layer 142 closest to front side 102 within opening 150 and the surface of BEOL region 120 that is farthest from back side 104 outside of opening 150 and A portion of insulating layer 158 may remain along sidewalls of opening 150 between BEOL region 120 and back side 104 of substrate 110. A subsequent etch, e.g., laser drilling, may be employed to remove portions of dielectric layer 142 to expose handle wafer 146. That is, opening 150 may be extended through dielectric layer 142 to handle wafer 146. In this etch process, any remaining portions of mask 148 (FIG. 8) may be removed and BEOL region 120 and substrate, including insulating layer 158, may continue to act as a mask during the etching of dielectric layer 142.

Figure 11:
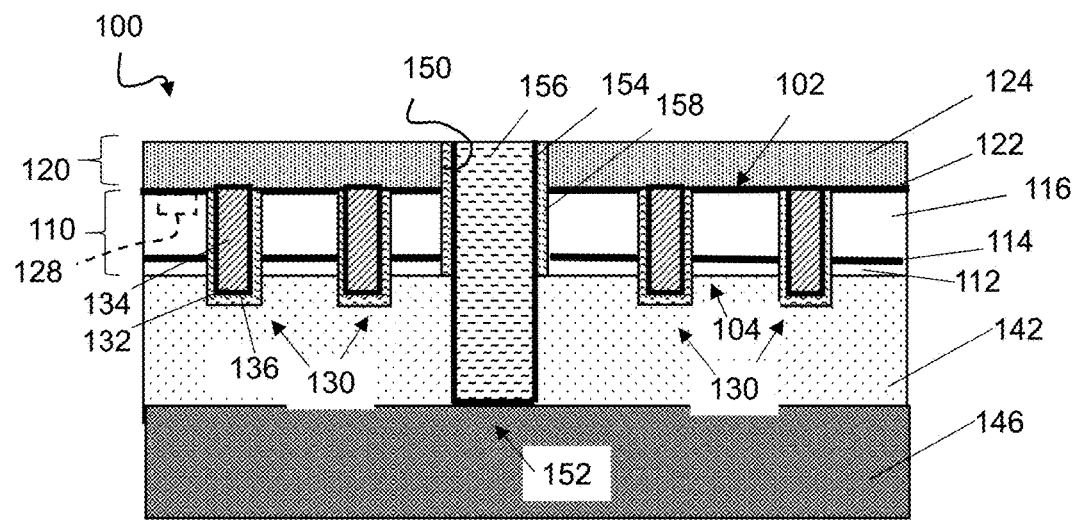

As shown in FIG. 11, a through-silicon via (TSV) 152 may be formed adjacent to at least one DT capacitor 130 within opening 150 and extend from BEOL region 120 over front side 102 through substrate 110 and dielectric layer 142 toward back side 104 to handle wafer 146. TSV 152 may include a liner layer 154 and a conductive metal layer 156. That is, opening 150 (including insulating layer 158) may be lined or coated with liner layer 154. Liner layer 154 may include, but is not limited to tantalum nitride, titanium nitride, tungsten nitride, or other equally suitable material to improve adhesion or other structural or electrical properties of the structure to be formed. Liner layer 154 may prevent electromigration of metal from metal layer 156 into adjacent surfaces. Metal layer 156 may be formed within opening 150 over liner layer 154 to substantially fill opening 150. Metal layer 156 may include copper or any other suitable conductive material such as, but not limited to, titanium, tungsten, tantalum, aluminum or alloys thereof. After, metal layer 156 is formed, metal layer 156 and liner layer 154 may be planarized to an upper surface of BEOL region 120 farthest from back side 104.

Figure 12:
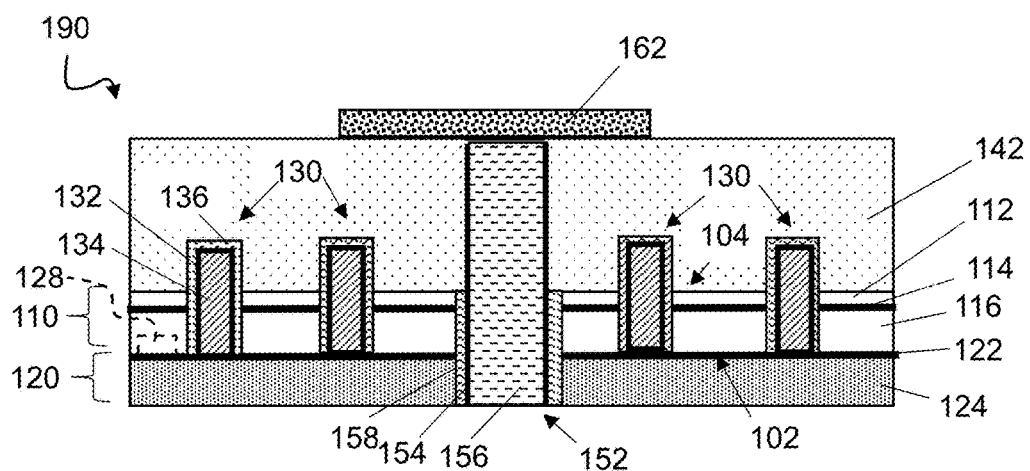

As shown in FIG. 12, wafer 100 may be flipped or turned over and handle wafer 146 (FIG. 11) may be removed from back side 104 to expose dielectric layer 142 and liner layer 154 of TSV 152. If liner layer 154 of TSV 152 is not exposed after the removal of handle wafer 146, for example if there was excess dielectric layer 142 between liner layer 154 and handle wafer 146, planarization or polishing may be performed to remove the excess dielectric layer 142 and expose liner layer 154. Additionally, in some embodiments, it may be desirable to remove portions of liner layer 154 that is farthest from front side 102 in order to expose metal layer 156. In such embodiments, planarization or etching may be used to remove portions of liner layer 154 that is farthest from front side 102 to expose metal layer 156 thereunder. Still referring to FIG. 12, a conductive pad 162 may be formed over back side 104 and may extend away from front side 102. That is, conductive pad 162 may be formed over TSV 152 and at least a portion of dielectric layer 142. Conductive pad 162 may be formed via deposition of a liner, e.g., any of the liner layers discussed herein, and a conductor, e.g., copper, patterning of a mask thereover, and etching. Conductive pad 162 may include a conductive metal, e.g., copper. Conductive pad 162 may facilitate further connections to additional devices in layers which may later be formed. Conductive pad 162 may be in electrical contact with liner layer 154 of TSV 152 or in direct contact with the exposed conductive metal 156.

Still referring to FIG. 12, the resulting integrated circuit structure 190, e.g., interposer, after conductive pad 162 is formed may include dielectric layer 142 extending from substrate 110 in a direction away from a front side 102. Integrated circuit structure 190 may also include BEOL region 120 extending from substrate 110 in a direction away from a back side 104. At least one DT capacitor 130 may extend from FEOL construction within SOI layer 116 of substrate 110 and toward back side 104. DT capacitors 130 may each be partially disposed within substrate 110 and dielectric layer 142. However, in other embodiments, DT capacitors 130 may be fully encased in substrate 110 or dielectric layer 142 as discussed herein. Further, integrated circuit structure 190 may include TSV 152 adjacent to at least one DT capacitor 130 and extending through dielectric layer 142, substrate 110, and BEOL region 120. Additionally, integrated circuit structure 190 may include a conductive pad 162 over TSV 152 and dielectric layer 142 extending away from front side 102. Integrated circuit structure 190 has improved performance in that DT capacitors 130 were fabricated in silicon, e.g., substrate 110, and TSV 152 has increased signal transmission due to being at least partially fabricated within dielectric layer 142. That is, signal retention is improved by minimizing the amount of silicon that surrounds TSV 152.

Figure 13:
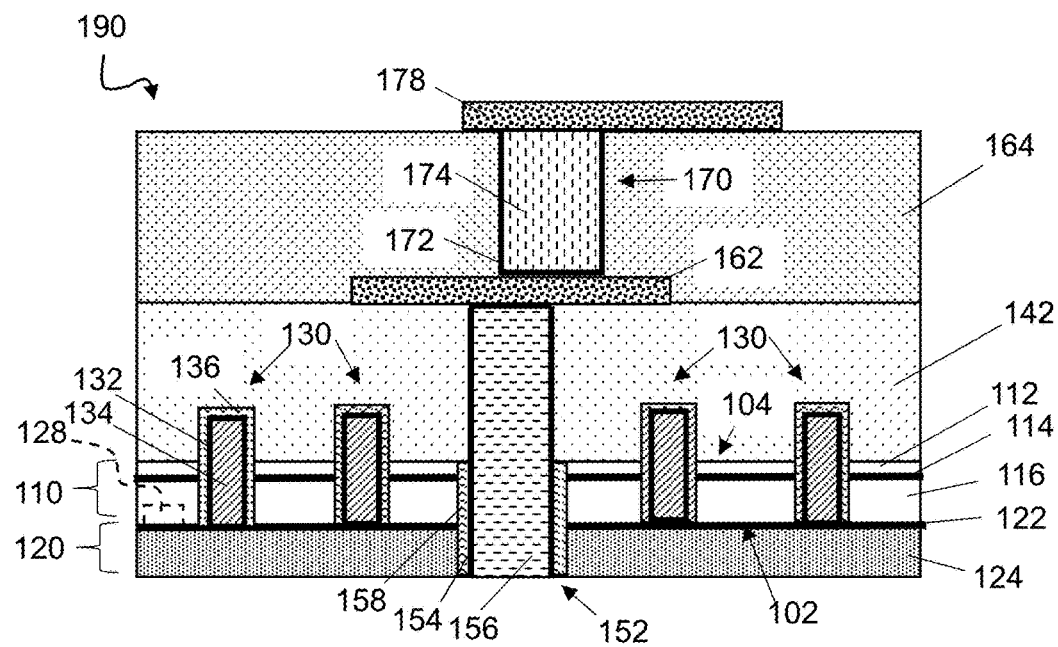

In some embodiments, it may be desirable to include additional wiring levels within integrated circuit structure 190. In those embodiments, another dielectric layer 164 may be formed over conductive pad 162 and extend away from front side 102 as shown in FIG. 13. That is, dielectric layer 164 may be formed over back side 104 extending away from front side 102. Dielectric layer 164 may cover conductive pad 162 and at least a portion of dielectric layer 142 over back side 104. Dielectric layer 164 may include any of the dielectric layer materials listed relative to dielectric layer 142. Further, a connection 170 may be formed within dielectric layer 164, e.g., via patterning, etching, deposition of a liner layer 172 and a conductive metal layer 174, and planarization. Connection 170 may be formed such that it contacts conductive pad 162. Connection 170 may include liner layer 172 and metal layer 174. Liner layer 172 may include any of the liner layer materials discussed herein. Metal layer 174 may include any of the conductive metal layer materials discussed herein. Liner layer 172 may be optionally removed or thinned at a bottom surface of connection 170 before formation of metal layer 174 to reduce resistivity. Further, another conductive pad 178 may be formed over dielectric layer 164 such that it contacts connection 170 and extends away from front side 102. As shown, connection 170 extends from conductive pad 162 toward conductive pad 178 in a direction away from front side 102.

Figure 14:
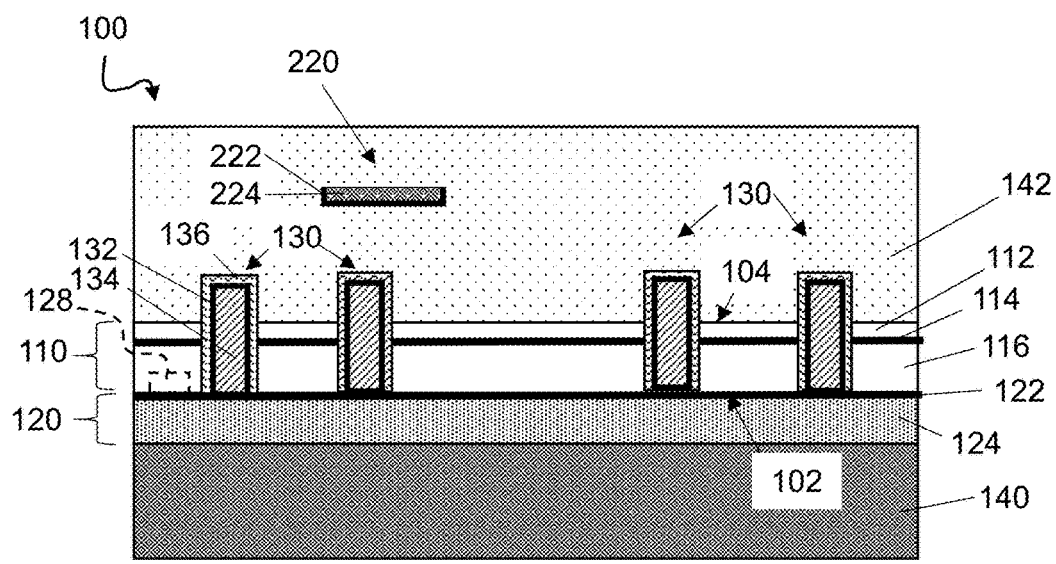
FIGS. 14-25 show cross-sectional views of a wafer undergoing aspects of a method according to other embodiments of the disclosure.

FIGS. 14-25 show other embodiments of the disclosure, alternative to that shown in FIGS. 5-12. As shown in FIG. 14, during formation of dielectric layer 142, a wire 220 may be formed within dielectric layer 142. For example, dielectric layer 142 may be formed by depositing a plurality of layers (not individually shown) and a dry or wet surface treatment such as a chemical etch, ash, or plasma may be performed in between the deposition of each layer so that the subsequent layer may have greater adhesion to the previous layer. During the formation of the plurality of layers, wire 220 may be formed therein using standard lithographic techniques. For example, a mask (not shown) may be formed over one of the layers in the plurality of layers of dielectric layer 142. The mask may be patterned to expose a portion of the one of the plurality of layers. That exposed portion may be etched to form an opening or trench (not shown). A liner layer 222 may be formed within the trench to substantially coat the trench. Subsequently, a metal 224 may be formed within the trench over liner layer 222 to substantially fill the trench. Any portion of liner layer 222 and/or metal 224 that is disposed outside of the trench may be removed via a planarization technique. Further, additional layers of dielectric layer 142 may be formed over wire 220 such that wire 220 is buried within dielectric layer 142. Other techniques known in the industry may also be used to achieve this structure.

Figure 15:
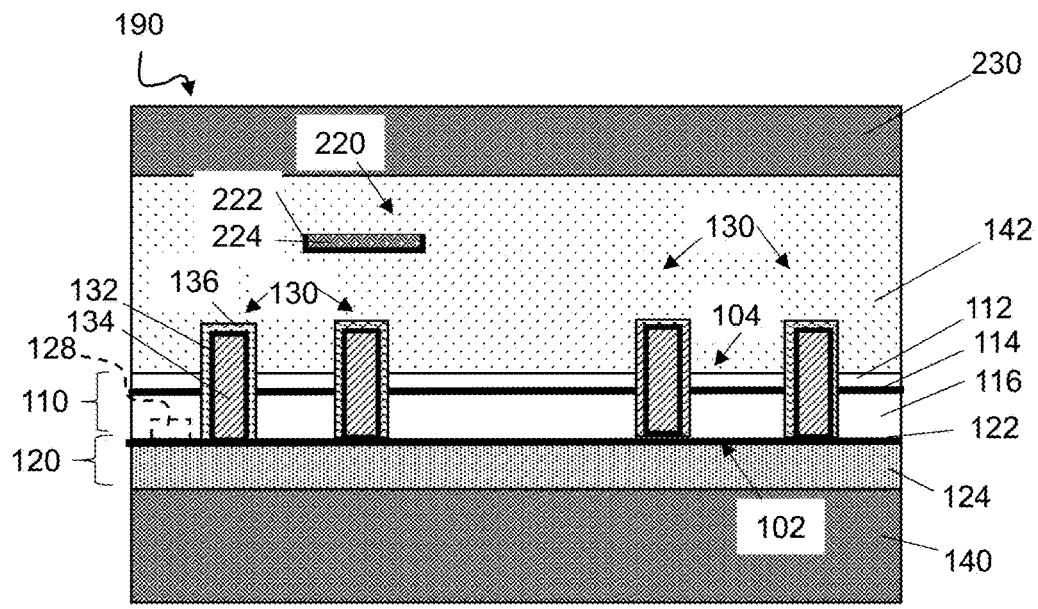
Figure 16:
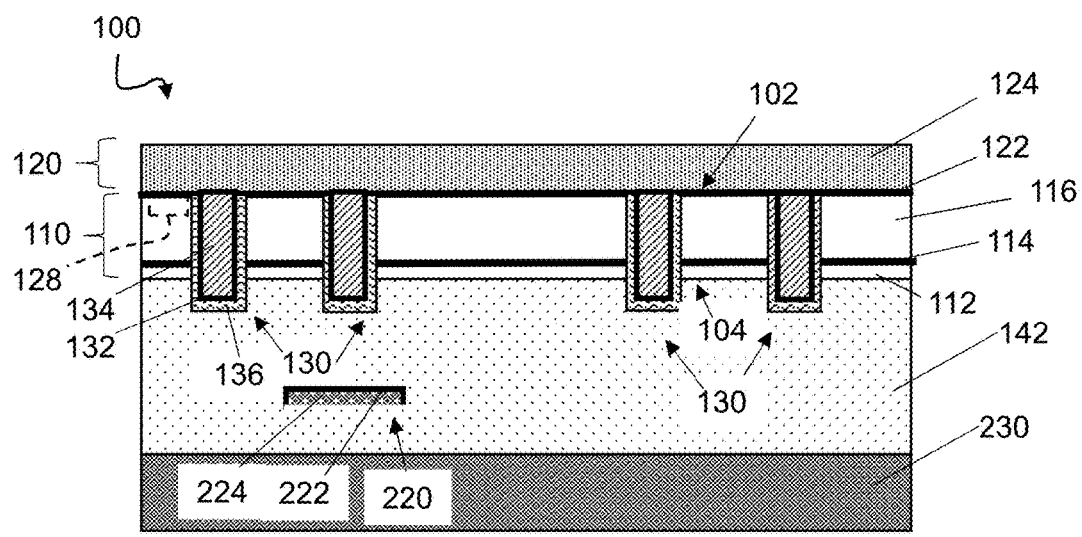

Referring now to FIGS. 15-16, another handle wafer 230 may be formed over dielectric layer 142 over back side 104 extending away from front side 102. Wafer 100 may be turned over or flipped, and handle wafer 140 (FIG. 15) may be removed from front side 102.

Figure 17:
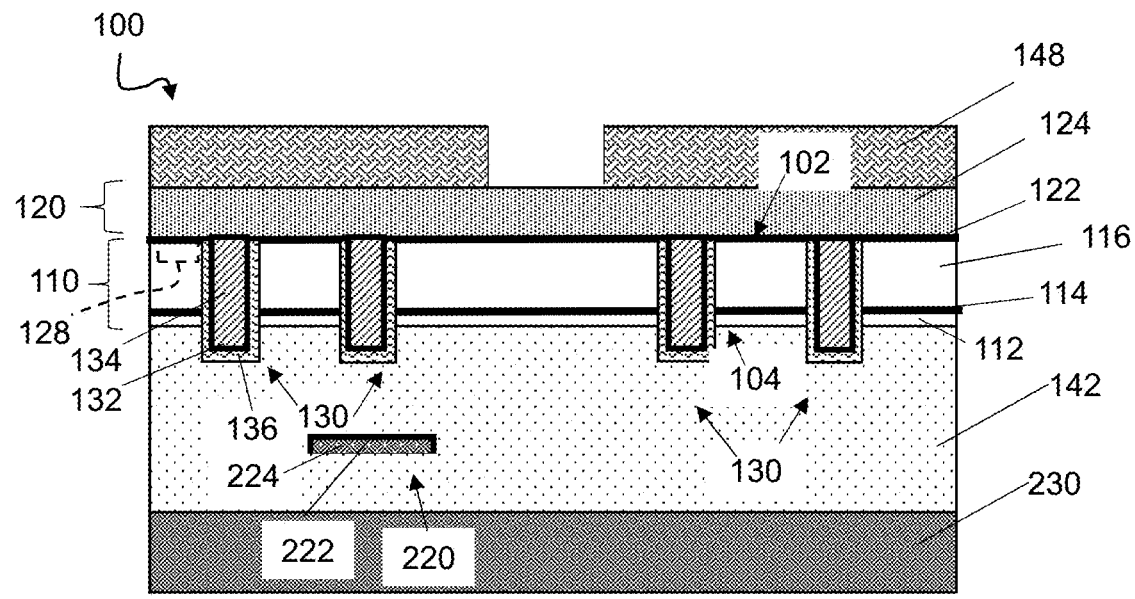
Figure 18:
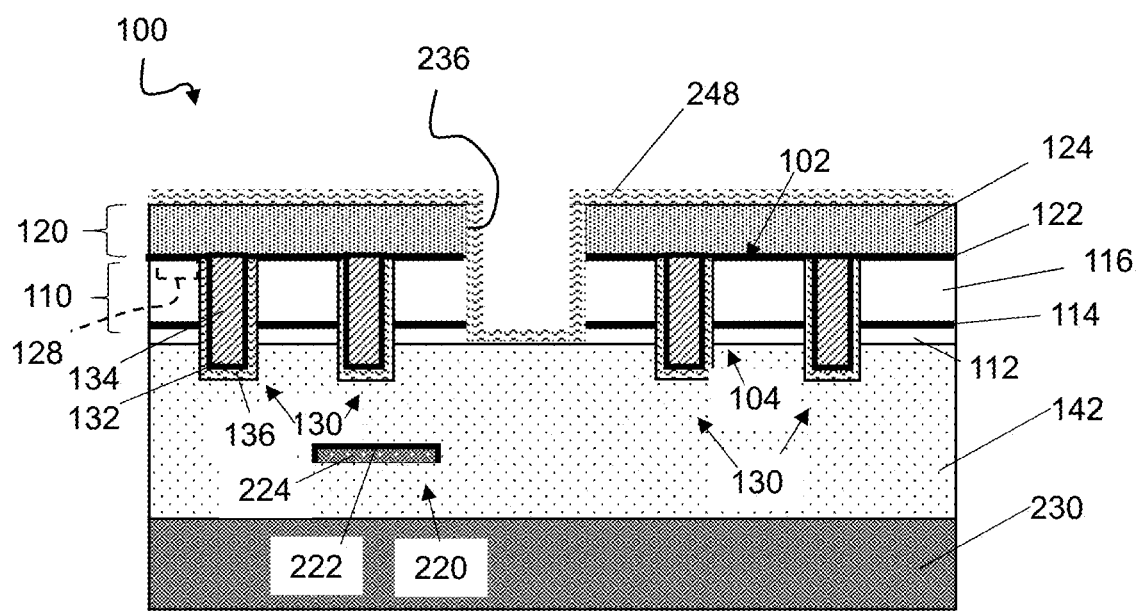
Figure 19:
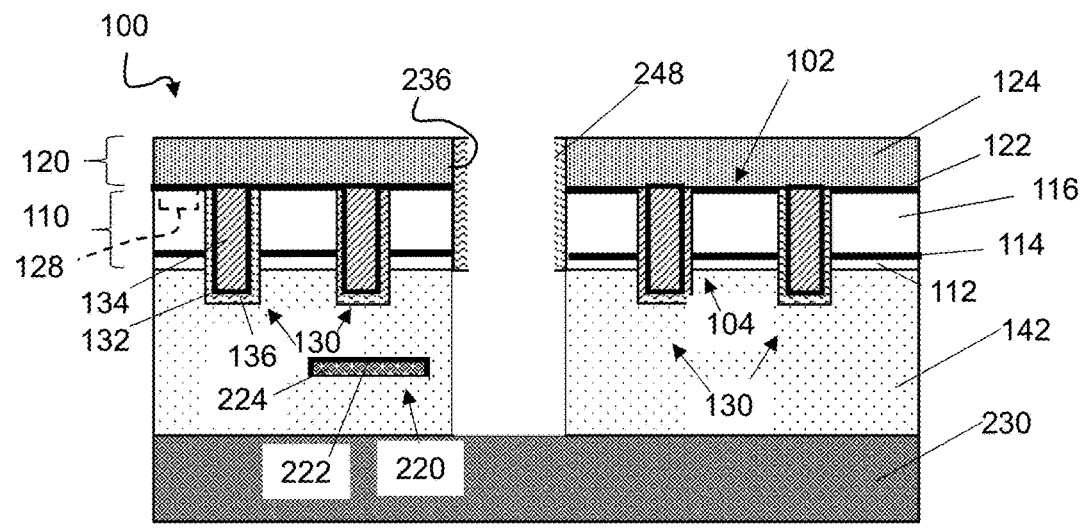

As shown in FIG. 17, mask 148 may be formed over BEOL region 120 on front side 102 of wafer 100 extending away from back side 104 of wafer 100. Mask 148 may be patterned and etched to expose BEOL region 120 to facilitate the formation of an opening 236 as shown in FIG. 18. After BEOL region 120 is exposed, opening 236 may be formed within BEOL region 120 and substrate 110. Opening 236 may be formed, for example, via etching, through BEOL region 120 and substrate 110 to expose dielectric layer 142. That is, BEOL layer 124, transition region 122, SOI layer 116, buried insulator layer 114, and any remaining semiconductor layer 112 may be etched to expose dielectric layer 142. A deep RIE, e.g., a Bosch etch, may be employed to remove portions of substrate 110 and BEOL region 120 to expose dielectric layer 142. Deep RIE etching may include a pulsed or time-multiplexed etching. During one method of deep RIE, a mode of an isotropic etch is alternated with a deposition of a chemically inert passivation layer (not shown). In this etch process, mask 148 (FIG. 17) may be eroded or fully removed. Additionally, after this etch process, the chemically inert passivation layer may be removed and an insulating layer 248 may be deposited, protecting the sidewalls of the opening 236 as shown in FIG. 18. Insulating layer 248 may be conformally deposited such that insulating layer 248 substantially lines sidewalls of opening 236 and is at least partially over dielectric layer 142 on a surface of dielectric layer 142 closest to front side 102 within opening 236. Additionally, insulating layer 248 may be formed over a surface of BEOL region 120 that is farthest from back side 104 outside of opening 236. Subsequently a directional RIE may be used to remove insulating layer 248 from all horizontal surfaces, including from the surface of dielectric layer 142 closest to front side 102 within opening 236 and the surface of BEOL region 120 that farthest from back side 104 outside of opening 236. A portion of insulating layer 248 may remain along sidewalls of openings 236 between BEOL region 120 and back side 104 of substrate 110. A subsequent etch, e.g., laser drilling, may be employed to remove portions of dielectric layer 142 to expose handle wafer 230. That is, opening 236 may be extended through dielectric layer 142 to handle wafer 230. In this etch process, any remaining portions of mask 148 may be removed and BEOL region 120 and substrate, including insulating layer 248, may continue to act as a mask during the etching of dielectric layer 142.

Figure 20:
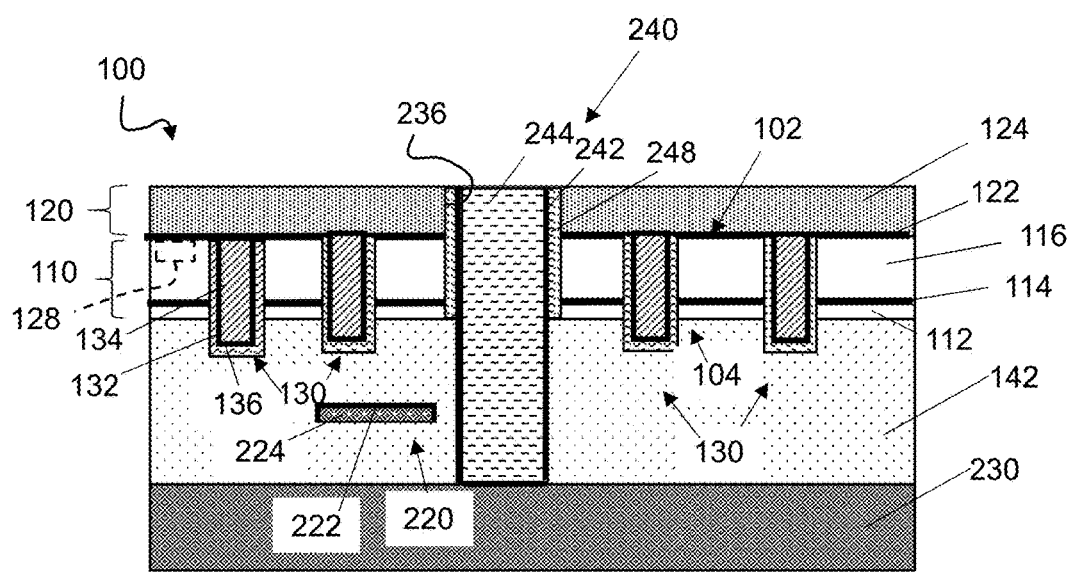

Referring now to FIG. 20, a TSV 240 may be formed within opening 236 adjacent to at least one DT capacitor 130 and extend from BEOL region 120 over front side 102 through substrate 110 and dielectric layer 142 to handle wafer 230. TSV 240 may include a liner layer 242 and a conductive metal layer 244. That is, opening 236 (including insulating layer 248) may be lined or coated with liner layer 242. Liner layer 242 may include, but is not limited to tantalum nitride, titanium nitride, or tungsten nitride, or other equally suitable material to improve adhesion or other structural or electrical properties of the structure to be formed. Further, a metal layer 244 may be formed within opening 236 over liner layer 242 to substantially fill opening 236. Metal layer 244 may include copper or any suitable conductive material such as, but not limited to, titanium, tungsten, tantalum, or aluminum. After, metal layer 244 is formed, metal layer 244 and liner layer 242 may be planarized to surface of BEOL region 120 farthest from back side 104.

Figure 21:
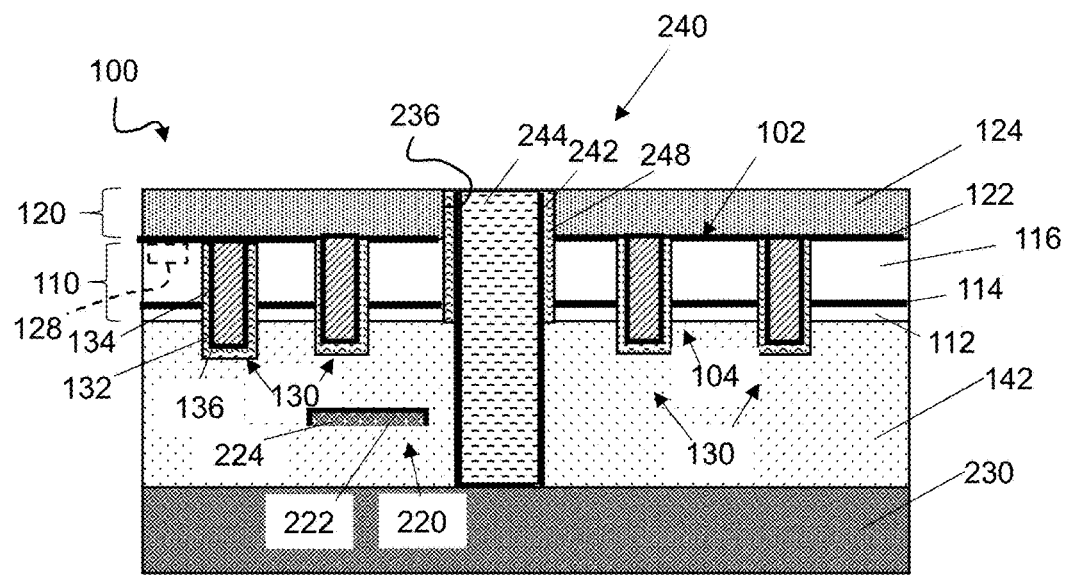
Figure 22:
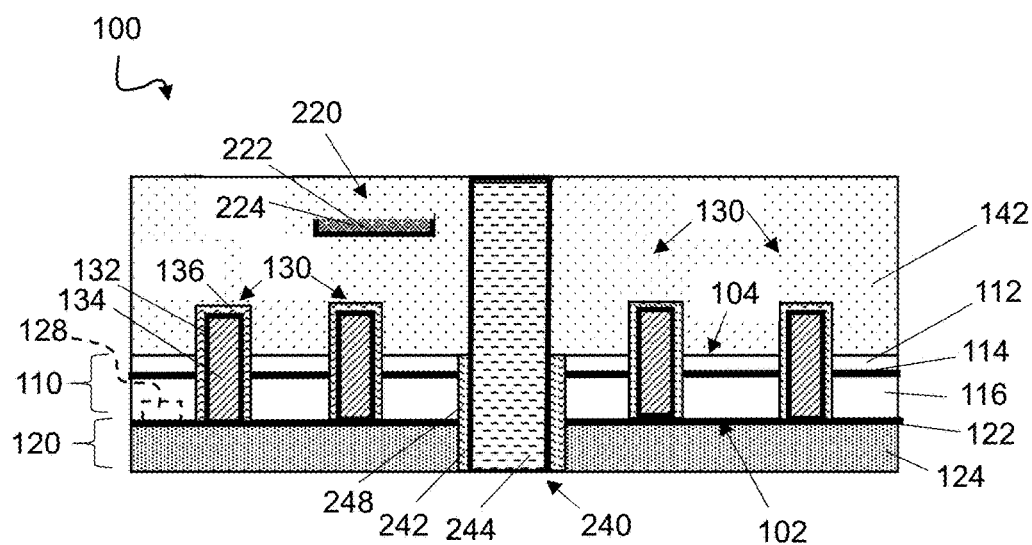
Figure 23:
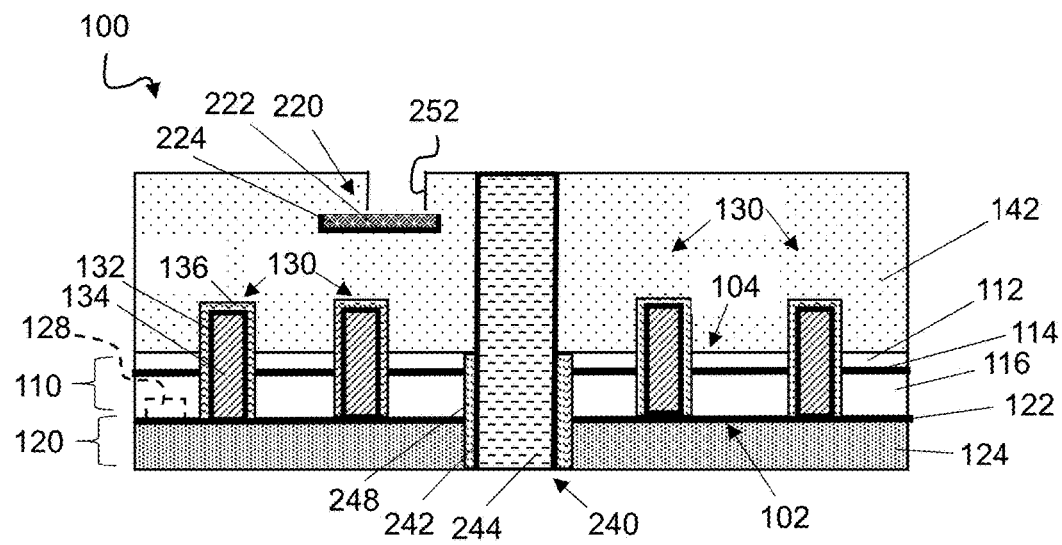
Figure 24:
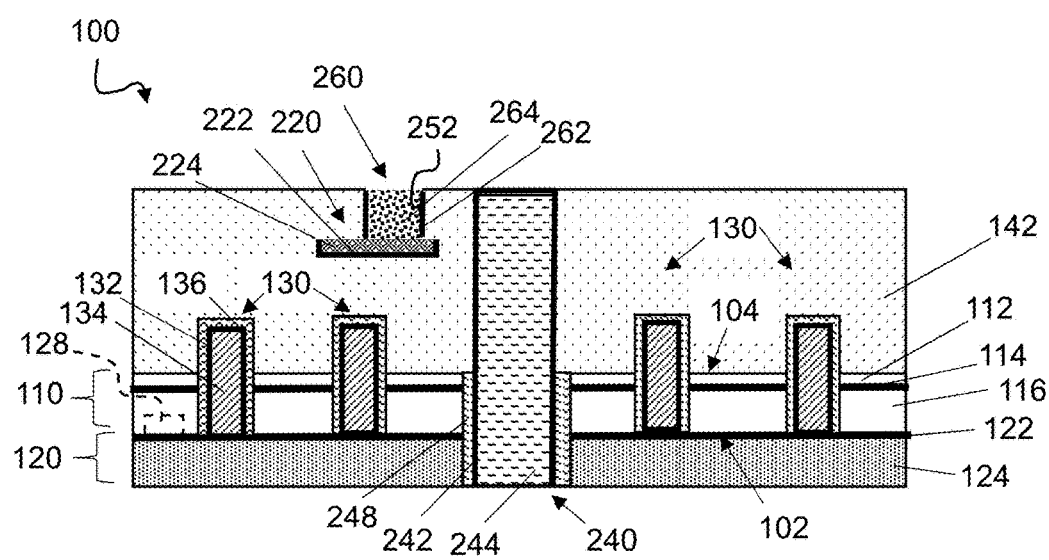

As shown in FIG. 21-22 handle wafer 230 may be removed from back side 104 and wafer 100 may be turned or flipped over. Further, an opening 252 may be formed within dielectric layer 142 to expose wire 220. A mask (not shown) may be formed over the additional layers of dielectric layer 142 and patterned to expose a portion of the additional layers that are directly over wire 220. The additional layers directly over wire 220 may be etched to form opening 252 to expose metal layer 224 of wire 220. A connection 260 may be formed within opening 252 as shown in FIG. 24. Connection 260 may extend from wire 220 and away from front side 102 to a surface of dielectric layer 142 that is farthest from front side 102. Connection 260 may include another liner layer 262 and a conductive metal layer 264. Liner layer 262 and metal layer 264 of connection 260 may include any of the materials listed herein for liner layers or metal layers. Connection 260 may be formed such that it is in electrical contact with wire 220. That is, liner layer 262 may be formed, e.g., deposited, to substantially coat opening 252 such that liner layer 262 is in contact with wire 220, e.g., metal layer 224 of wire 220. Additionally, metal layer 264 may be formed, e.g., deposited, over liner layer 262 to substantially fill opening 252. Any portion of liner layer 262 and/or metal layer 264 that is disposed outside of opening 252 may be removed via a planarization technique, e.g., CMP.

Figure 25:
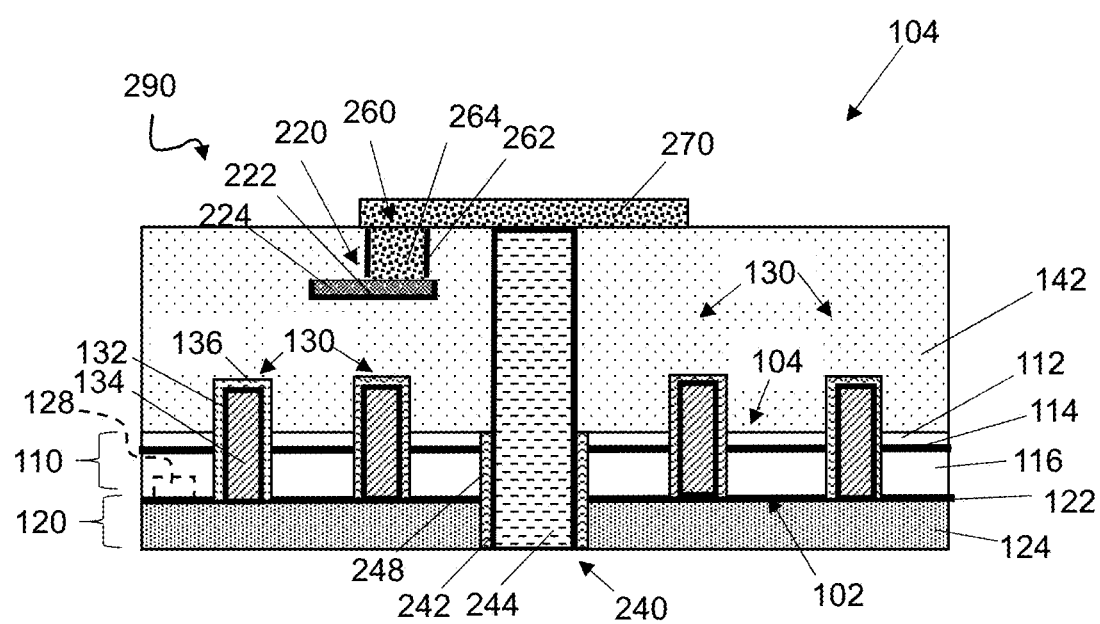

After connection 260 is formed such that it is in electrical contact with wire 220, a conductive pad 270 may be formed as described with respect to FIG. 12 as shown in FIG. 25 to form a resulting integrated circuit structure 290. However, in this embodiment, conductive pad 270 may be formed such that it is in electrical connection with both TSV 240 and connection 260. That is, conductive pad 270 and connection 260 provide electrical connection between wire 220 and TSV 240. Conductive pad 270 may be formed over TSV 240, connection 260, and at least a portion of dielectric layer 142 over back side 104. In another embodiment (not shown), opening 252 may be formed and then filled with liner layer 262 and metal layer 264 at the same time that conductive pad 270 is formed such that conductive pad 270 and connection 260 include the same materials.

Still referring to FIG. 25, the resulting integrated circuit structure 290, e.g., interposer, after conductive pad 270 is formed may include dielectric layer 142 extending from substrate 110 in a direction away from a front side 102. Integrated circuit structure 290 may also include BEOL region 120 extending from substrate 110 in a direction away from a back side 104. At least one DT capacitor 130 may extend from FEOL construction within SOI layer 116 of substrate 110 and toward back side 104. DT capacitors 130 may each be partially disposed within substrate 110 and dielectric layer 142. However, in other embodiments, DT capacitors 130 may be fully encased in substrate 110 or dielectric layer 142 as described herein. Further, integrated circuit structure 290 may include TSV 240 adjacent to at least one DT capacitor 130 and extending through dielectric layer 142, substrate 110, and BEOL region 120. Wire 220 may be disposed within dielectric layer 142. Additionally, integrated circuit structure 290 may include connection 260 within dielectric layer 142 and extending from wire 220 away from front side 102. Conductive pad 250 may be disposed over TSV 240 and dielectric layer 142, extending away from front side 102. Wire 220 may be electrically connected to TSV 140 by connection 260 and conductive pad 270. Integrated circuit structure 290 has improved performance in that DT capacitors 130 were fabricated in silicon (substrate 110) and TSV 240 has increased signal transmission due to being fabricated within dielectric layer 142. While not shown, it is to be understood that additional wiring levels may be formed within integrated circuit structure 290 as previous described with respect to FIG. 13.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An interposer comprising:
   a first dielectric layer extending from a substrate in a direction away from a front side of the substrate;
   a back-end-of-the-line (BEOL) region extending from the front side of the substrate in a direction away from a back side of the substrate;
   a deep trench (DT) capacitor within the substrate and extending from the front side of the substrate toward the back side of the substrate, the DT capacitor having a first portion within the substrate and a second portion within the first dielectric layer;
   a through silicon via (TSV) adjacent to the DT capacitor and extending through the first dielectric layer, the substrate, and the BEOL region; and
   a wire within the first dielectric layer adjacent to and separated from the TSV, the wire including a liner layer and a metal layer.

2. The interposer of claim 1, further comprising:
   a conductive pad extending from the TSV in a direction away from the front side of the substrate, at least a portion of the conductive pad being in contact with a portion of the first dielectric layer.

3. The interposer of claim 1, further comprising:
   a connection within the first dielectric layer, the connection including a liner layer and a metal layer, the connection in contact with the wire and extending from the wire in a direction away from a front side of the interposer.

4. The interposer of claim 3, further comprising:
   a conductive pad extending from the TSV in a direction away from the front side of the substrate and contacting at least a portion of the first dielectric layer, at least a portion of the conductive pad being in contact with the connection such that the conductive pad and the connection provide electrical contact between the TSV and the wire.

5. The interposer of claim 4, further comprising:
   a second dielectric layer extending from the first dielectric layer in a direction away from the front side of the substrate, the second dielectric layer covering the conductive pad.

6. The interposer of claim 5, further comprising:
a second conductive pad in contact with the second dielectric layer on an opposing side of the second dielectric layer relative to the first conductive pad; and
a second connection within the second dielectric layer electrically connecting the first conductive pad and the second conductive pad.

7. The interposer of claim 1, wherein the first dielectric layer includes polymer.

8. The interposer of claim 1, wherein the DT capacitor is absent from the BEOL region.

9. An interposer comprising:
a first dielectric layer extending from a substrate in a direction away from a front side of the substrate;
a back-end-of-the-line (BEOL) region extending from the substrate in a direction away from a back side of the substrate;
a deep trench (DT) capacitor within the substrate and extending toward the back side of the substrate, the DT capacitor having a first portion within the substrate and a second portion within the first dielectric layer;
a through silicon via (TSV) adjacent to the DT capacitor and extending through the first dielectric layer, the substrate, and the BEOL region; and
a wire within the first dielectric layer adjacent to and separated from the TSV, the wire including a liner layer and a metal layer.

10. The interposer of claim 9, further comprising:
a connection within the first dielectric layer, the connection including a liner layer and a metal layer, the connection in contact with the wire and extending from the wire in a direction away from a front side of the interposer.

11. The interposer of claim 10, further comprising:
a conductive pad extending from the TSV in a direction away from the front side of the substrate and contacting at least a portion of the first dielectric layer, at least a portion of the conductive pad being in contact with the connection such that the conductive pad and the connection provide electrical contact between the TSV and the wire.

12. The interposer of claim 11, further comprising:
a second dielectric layer extending from the first dielectric layer in a direction away from the front side of the substrate, the second dielectric layer covering the conductive pad.

13. The interposer of claim 12, further comprising:
a second conductive pad in contact with the second dielectric layer on an opposing side of the second dielectric layer relative to the first conductive pad; and
a second connection within the second dielectric layer electrically connecting the first conductive pad and the second conductive pad.

14. The interposer of claim 9, wherein the first dielectric layer includes polymer.

15. The interposer of claim 9, wherein the DT capacitor is absent from the BEOL region.

* * * * *